(12) United States Patent
Cho et al.

(10) Patent No.: US 10,643,538 B2
(45) Date of Patent: May 5, 2020

(54) PIXEL AND ORGANIC LIGHT EMITTING DISPLAY DEVICE INCLUDING THE SAME

(71) Applicant: SAMSUNG DISPLAY CO., LTD., Yongin-si, Gyeonggi-do (KR)

(72) Inventors: Sung Yeon Cho, Yongin-si (KR); Hui Nam, Yongin-si (KR); Tae Jin Kim, Yongin-si (KR); Myung Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 103 days.

(21) Appl. No.: 15/089,006

(22) Filed: Apr. 1, 2016

(65) Prior Publication Data

US 2017/0069260 A1    Mar. 9, 2017

(30) Foreign Application Priority Data

Sep. 9, 2015  (KR) ........................ 10-2015-0127870

(51) Int. Cl.
| | |
|---|---|
| *G09G 3/3266* | (2016.01) |
| *G09G 3/325* | (2016.01) |
| *G09G 3/3283* | (2016.01) |
| *G11C 19/28* | (2006.01) |
| *G09G 3/3233* | (2016.01) |
| *G09G 3/20* | (2006.01) |

(52) U.S. Cl.
CPC .......... *G09G 3/325* (2013.01); *G09G 3/2022* (2013.01); *G09G 3/3233* (2013.01); *G09G 3/3266* (2013.01); *G09G 3/3283* (2013.01); *G11C 19/28* (2013.01); *G09G 2300/0426* (2013.01); *G09G 2300/0809* (2013.01); *G09G 2300/0814* (2013.01); *G09G 2300/0842* (2013.01); *G09G 2300/0861* (2013.01); *G09G 2310/0262* (2013.01); *G09G 2310/0267* (2013.01); *G09G 2310/0286* (2013.01); *G09G 2310/08* (2013.01)

(58) Field of Classification Search
CPC .. G09G 3/3266; G09G 3/3233; G09G 3/3258; G09G 3/3291; G09G 3/3275; G09G 3/3208; G09G 3/3283; G09G 2330/02; G09G 2330/08
See application file for complete search history.

(56) References Cited

U.S. PATENT DOCUMENTS

| | | | |
|---|---|---|---|
| 8,446,345 B2 * | 5/2013 | Yu ........................ | G09G 3/3233 345/76 |
| 2005/0259703 A1 * | 11/2005 | You ....................... | G09G 3/3233 372/38.07 |

(Continued)

FOREIGN PATENT DOCUMENTS

KR    10-2014-0078920 A    6/2014

*Primary Examiner* — Kent W Chang
*Assistant Examiner* — Scott Au
(74) *Attorney, Agent, or Firm* — Lewis Roca Rothgerber Christie LLP

(57) ABSTRACT

A pixel includes: a first driver connected to a first driving data line; a second driver connected to a second driving data line; and an organic light emitting diode (OLED) connected to the first driver and the second driver, the OLED to emit light in response to a data signal supplied to the first driving data line when the first driver is driven, and to emit light in response to a data signal supplied to the second driving data line when the second driver is driven.

17 Claims, 5 Drawing Sheets

(56) References Cited

U.S. PATENT DOCUMENTS

| | | | | |
|---|---|---|---|---|
| 2006/0244374 A1* | 11/2006 | Kim | ................... | H01L 25/048 |
| | | | | 313/506 |
| 2007/0139314 A1* | 6/2007 | Park | ................... | G09G 3/3233 |
| | | | | 345/76 |
| 2008/0180364 A1* | 7/2008 | Kim | ................... | G09G 3/3233 |
| | | | | 345/76 |
| 2011/0216056 A1* | 9/2011 | Yoo | ..................... | G09G 3/32 |
| | | | | 345/212 |
| 2014/0168290 A1 | 6/2014 | Yang et al. | | |

* cited by examiner

PIXEL AND ORGANIC LIGHT EMITTING DISPLAY DEVICE INCLUDING THE SAME

CROSS-REFERENCE TO RELATED APPLICATION

This application claims priority to and the benefit of Korean Patent Application No. 10-2015-0127870, filed on Sep. 9, 2015, in the Korean Intellectual Property Office, the entire contents of which are incorporated herein by reference in their entirety.

BACKGROUND

1. Field

One or more aspects of example embodiments of the present invention relate to a pixel, and an organic light emitting display device including the same.

2. Description of the Related Art

An organic light emitting display device displays an image by using organic light emitting diodes (OLEDs) that generate light components by re-combination of electrons and holes. The organic light emitting display device has a high response speed, and may display a clear image.

In general, the organic light emitting display device includes a plurality of pixels including driving transistors and OLEDs. The pixels control amounts of currents supplied to the OLEDs by using the driving transistors, and may display corresponding grayscale levels (e.g., gray levels).

SUMMARY

One or more example embodiments of the present invention relate to a pixel capable of reducing power consumption, and an organic light emitting display device including the same.

According to an embodiment of the present invention, a pixel includes: a first driver connected to a first driving data line; a second driver connected to a second driving data line; and an organic light emitting diode (OLED) connected to the first driver and the second driver, the OLED being configured: to emit light in response to a data signal supplied to the first driving data line when the first driver is driven; and to emit light in response to a data signal supplied to the second driving data line when the second driver is driven.

The first driver may be configured to be driven by an active matrix (AM) driving method, and the second driver may be configured to be driven by a passive matrix (PM) driving method.

A period during which the first driver is driven and a period during which the second driver is driven may not overlap with each other.

The second driver may include a first transistor connected to a first node and connected to the second driving data line, and a first control line configured to supply a first control signal to the second driver may be connected to the second driver.

The first transistor may include a first electrode connected to the first node, a second electrode connected to the second driving data line, and a gate electrode connected to the first control line, and the first node may be connected to an anode of the OLED.

The OLED may be configured to emit light when the first control signal is supplied to the first control line.

The data signal may be supplied to the second driving data line during a period in which the first control signal is supplied to the first control line.

The pixel may further include a second transistor connected between the OLED and a second power source, and a second control line configured to supply a second control signal to the second driver may be connected to the second driver.

The second transistor may include a first electrode connected to the OLED, a second electrode connected to the second power source, and a gate electrode connected to the second control line.

The first control signal may be continuously supplied to the first control line, when the second driver is driven, and the OLED may be configured to emit light when the second control signal is supplied to the second control line.

The data signal may be supplied to the second driving data line during a period in which the second control signal is supplied to the second control line.

A first power source and a scan line may be connected to the first driver, the scan line being configured to supply a scan signal to the first driver, and the scan signal may not be supplied to the scan line, when the second driver is driven.

According to an embodiment of the present invention, an organic light emitting display device includes: a scan driver configured to supply scan signals to n (n is a natural number greater than or equal to 2) scan lines; a data driver configured to supply first driving data signals to m (m is a natural number greater than or equal to 2) first driving data lines, and to supply second driving data signals to m second driving data lines; a timing controller configure to supply signals for generating the first driving data signals and signals for generating the second driving data signals to the data driver; and a plurality of pixels connected to the n scan lines, the m first driving data lines, and the m second driving data lines, a pixel from among the plurality of pixels being connected to an ith (i is a natural number less than or equal to n) scan line, a jth (j is a natural number less than or equal to m) first driving data line, and a jth second driving data line, the pixel including: a first driver connected to a first power source and the jth first driving data line; a second driver connected to the jth second driving data line; and an organic light emitting diode (OLED) connected to the first driver and the second driver, the OLED being configured to: emit light in response to a first driving data signal supplied to the jth first driving data line when the first driver is driven; and to emit light in response to a second driving data signal supplied to the jth second driving data line when the second driver is driven.

The first driver may be configured to be driven by an active matrix (AM) driving method, and the second driver may be configured to be driven by a passive matrix (PM) driving method.

The organic light emitting display device may further include a control driver configured to supply first control signals to n first control lines, the pixel may be connected to an ith first control line, and the second driver may include a first transistor connected to a first node and connected to the jth second driving data line.

The first transistor may include a first electrode connected to the first node, a second electrode connected to the jth second driving data line, and a gate electrode connected to the ith first control line, and the first node may be connected to an anode of OLED.

The organic light emitting display device may further include a plurality of second power sources connected to the plurality of pixels, each of the second power sources connected to a plurality of pixels arranged in an ith horizontal line being connected to each other, and the OLED may be configured to emit light when a second data driving signal supplied to the jth second driving data line and a second power supplied to the second power sources connected to the pixels of the ith horizontal line are concurrently applied during a period in which the second driver is driven.

The first control signal may be continuously supplied to the first control line during the period in which the second driver is driven.

The scan signal may not be supplied to the ith scan line, during the period in which the second driver is driven.

According to one or more aspects of example embodiments of the present invention, because a pixel may be selectively driven by a combined driving method including an active matrix (AM) driving method and a passive matrix (PM) driving method, it may be possible to reduce power consumption.

BRIEF DESCRIPTION OF THE DRAWINGS

The above and other aspects and features of the present invention will become more apparent to those skilled in the art from the following detailed description of the example embodiments with reference to the accompanying drawings.

DETAILED DESCRIPTION

Figure 1:
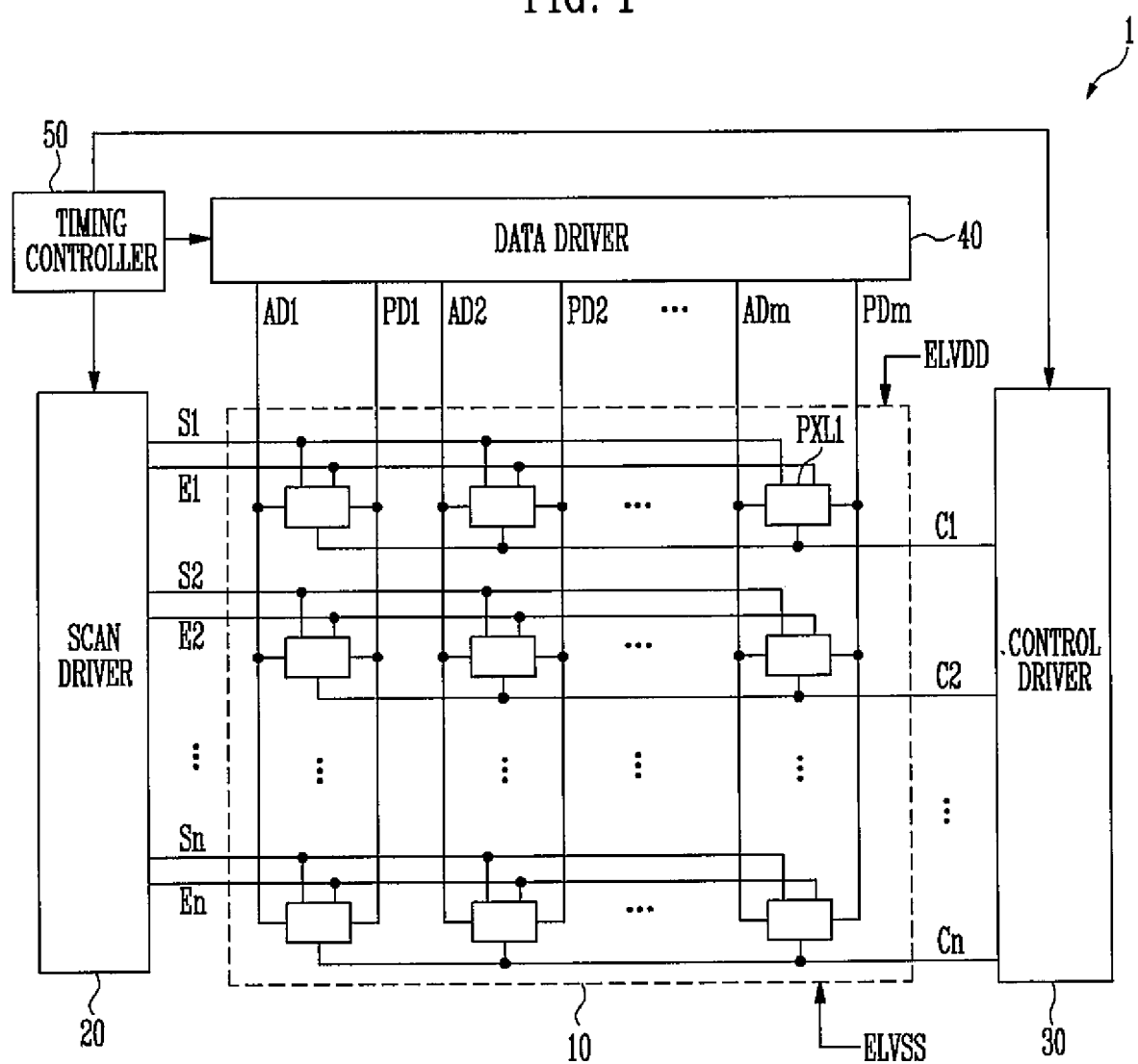
FIG. 1 is a view illustrating an organic light emitting display device according to an embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a pixel and an organic light emitting display device including the same according to one or more embodiments of the present invention will be described with reference to the accompanying drawings.

FIG. 1 is a view illustrating an organic light emitting display device 1 according to an embodiment of the present invention.

Referring to FIG. 1, the organic light emitting display device 1 may include a pixel unit 10 including a plurality of pixels PXL1, a scan driver 20, a control driver 30, a data driver 40, and a timing controller 50.

In addition, the organic light emitting display device 1 may further include scan lines S1 to Sn and emission control lines E1 to En that are connected to the scan driver 20 and the plurality of pixels PXL1, control lines C1 to Cn that are connected to the control driver 30 and the plurality of pixels PXL1, and 2×m data lines AD1 to ADm and PD1 to PDm that are connected to the data driver 40 and the plurality of pixels PXL1 (here, n and m are natural numbers greater than or equal to 2).

Each of the plurality of pixels PXL1 may be connected to two data lines, a scan line, an emission control line, and a control line. In particular, each of the plurality of pixels PXL1 may be connected to one of the plurality of first driving data lines AD1 to ADm and one of the plurality of second driving data lines PD1 to PDm.

For example, pixels positioned at a jth column may be connected to a jth first driving data line ADj and a jth second driving data line PDj (here, j is a natural number less than or equal to m).

In FIG. 1, for convenience, each pixel PXL1 is illustrated as being connected to one scan line. However, the present invention is not limited thereto, and each pixel PXL1 may be connected to a plurality of scan lines.

Pixels PXL1 positioned in an ith row, for example, may be connected to an ith scan line Si, an ith emission control line Ei, and an ith control line Ci (here, i is a natural number less than or equal to n).

The plurality of pixels PXL1 may receive a first power from a first power source ELVDD, a second power from a second power source ELVSS, and an initializing power from an initializing power source that are supplied from a power source supplying unit (e.g., a power supply device).

In addition, the plurality of pixels PXL1 may generate light components corresponding to data signals by currents that flow through organic light emitting diodes (OLEDs).

The scan driver 20 generates scan signals in response to scan driving control signals received from the timing controller 50, and may supply the generated scan signals to the scan lines S1 to Sn. The scan driver 20 may supply (e.g., sequentially supply) the scan signals to the first to nth scan lines S1 to Sn.

In addition, the scan driver 20 generates emission control signals by control of the timing controller 50, and may supply the generated emission control signals to the emission control lines E1 to En.

The control driver 30 generates control signals by control of the timing controller 50, and may supply the generated control signals to the control lines C1 to Cn.

While in FIG. 1, it is illustrated that each of the control lines C1 to Cn is formed of a single line, the present invention is not limited thereto. That is, according to a detailed circuit structure of the pixel PXL1 to be described hereinafter, each of the control lines C1 to Cn may be formed of a first control line and a second control line.

For example, the ith control line Ci located at the ith row may include an ith first control line Cai and an ith second control line Cbi. Therefore, the ith first control line Cai and the ith second control line Cbi may be connected to each of the plurality of pixels PXL1 located at the ith row.

In this case, the control driver 30 may generate first control signals supplied to a plurality of first control lines and second control signals supplied to a plurality of second control lines.

The data driver 40 generates the data signals by control of the timing controller 50, and may supply the generated data signals to the data lines AD1 to ADm and PD1 to PDm.

The data lines AD1 to ADm and PD1 to PDm may include the plurality of first driving data lines AD1 to ADm and the plurality of second driving data lines PD1 to PDm.

The data driver 40 may generate first driving data signals, and may supply the generated first driving data signals to the plurality of first driving data lines AD1 to ADm, when the plurality of pixels PXL1 are driven by a first driving method. The data driver 40 may generate second driving data signals, and may supply the generated second driving data signals to the plurality of second driving data lines PD1 to PDm, when the plurality of pixels PXL1 are driven by a second driving method.

When the plurality of pixels PXL1 are driven by the first driving method, the OLEDs generate light components corresponding to the first driving data signals supplied by the plurality of first driving data lines AD1 to ADm. When the plurality of pixels PXL1 are driven by the second driving method, the OLEDs may generate light components corresponding to the second driving data signals supplied by the plurality of second driving data lines PD1 to PDm.

Accordingly, two data lines, that is, one of the plurality of first driving data lines AD1 to ADm and one of the plurality of second driving data lines PD1 to PDm, may be connected to each of the plurality of pixels PXL1.

In FIG. 1, for convenience, the scan driver 20, the control driver 30, the data driver 40, and the timing controller 50 are separately illustrated. However, the present invention is not limited thereto, and at least some of the scan driver 20, the control driver 30, the data driver 40, and the timing controller 50 may be integrated with each other.

In addition, in FIG. 1, n scan lines S1 to Sn and n emission control lines E1 to En are illustrated. However, the present invention is not limited thereto. For example, at least one dummy scan line and/or at least one dummy emission control line may be added according to the structure of the pixel PXL1.

As described above, each of the pixels PXL1 may be additionally connected to a scan line and/or an emission control line that are positioned in a previous (e.g., prior) or next (e.g., posterior) horizontal line according to a circuit structure.

In addition, in FIG. 1, the scan driver 20 is illustrated as being connected to the scan lines S1 to Sn and the emission control lines E1 to En. However, the present invention is not limited thereto. For example, the emission control lines E1 to En may be connected to another driver (e.g., an emission control driver or an additional driver), and may receive the emission control signals therefrom.

In addition, in FIG. 1, the data driver 40 is illustrated as being connected to the plurality of first driving data lines AD1 to ADm and the plurality of second driving data lines PD1 to PDm. However, the present invention is not limited thereto. For example, the plurality of second driving data lines PD1 to PDm may be connected to an additional data driver, and may receive the second driving data signals therefrom.

Figure 2:
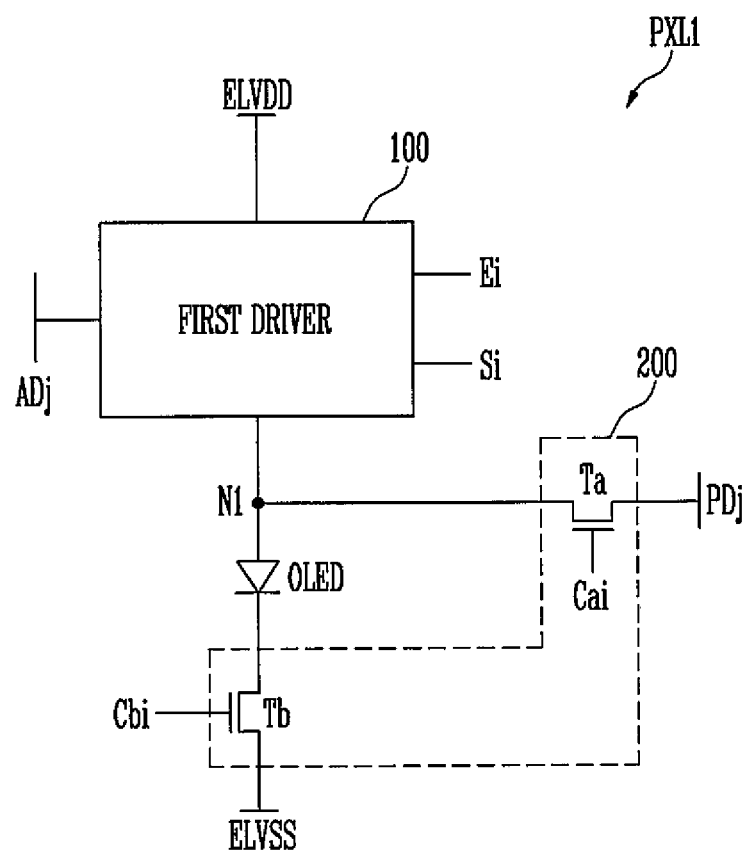
FIG. 2 is a view schematically illustrating an embodiment of the pixel of FIG. 1.

FIG. 2 is a view schematically illustrating an embodiment of the pixel of FIG. 1. In FIG. 2, for convenience, a pixel PXL1 located at a region formed by crossing the jth first driving data line ADj and the ith scan line Si is illustrated (here, i is a natural number less than or equal to n, and j is a natural number less than or equal to m).

The pixel PXL1 may be connected to the jth second driving data line PDj, the ith emission control line Ei, the ith first control line Cai, and the ith second control line Cbi, as well as to the jth first driving data line ADj and the ith scan line Si.

Referring to FIG. 2, the pixel PXL1 may include a first driver 100, an OLED, and a second driver 200.

The first driver 100 may control the OLED to emit light by an active matrix (AM) driving method. The second driver 200 may control the OLED to emit light by a passive matrix (PM) driving method.

Therefore, the OLED emits light in response to the first driving data signal supplied to the jth first driving data line ADj when the first driver 100 is driven, and may emit light in response to the second driving data signal supplied to the jth second driving data line PDj when the second driver 200 is driven.

Accordingly, while the first driver 100 is driven, the second driver 200 is not driven, and while the second driver 200 is driven, the first driver 100 is not driven.

That is, the pixel PXL1 according to one or more embodiments of the present invention may be driven by the AM driving method or the PM driving method according to a situation (e.g., a predetermined situation).

The first driver 100 may be connected between the first power source ELVDD and the anode electrode of the OLED (or a first node N1).

As described above, the first driver 100 controls the OLED to emit light according to the first driving method (e.g., the AM driving method), and a pixel circuit structure thereof is not limited. Any suitable pixel circuit in which an OLED may emit light according to the AM driving method may be included in the first driver 100.

For example, at least a driving transistor that supplies a driving current to the OLED, and a storage capacitor in which a data voltage transmitted in response to a scan signal is stored, may be included in the first driver 100.

The driving transistor may supply a driving current corresponding to the data voltage stored in the storage capacitor to the OLED, and the OLED may emit light having a brightness corresponding to the driving current.

The first driver 100 may further include an emission control line of the emission control lines E1 to En for controlling an emission of the OLED, and an initializing power source (or a reference power source) for initializing the anode electrode of the OLED after the emission of the OLED is stopped. Depending on the pixel circuit structure, the first driver 100 may further include a plurality of transistors and at least one capacitor.

Signals (e.g., a scan signal and an emission control signal) supplied to the ith scan line Si and the ith emission control line Ei that are connected to the first driver 100 may control on and off operations of the transistor(s) included in the first driver 100.

In FIG. 2, it is illustrated that the ith scan line Si and the ith emission control line Ei are connected to the first driver 100. However, the present invention is not limited thereto. For example, according to a structure of the first driver 100 and a method of driving the first driver 100, another scan line adjacent to the ith scan line Si and/or another emission control line adjacent to the ith emission control line Ei may be also connected to the first driver 100.

The second driver 200 may include a first PM driving transistor Ta connected between the first node N1 and the jth second driving data line PDj, and a second PM driving transistor Tb connected between a cathode electrode of the OLED and the second power source ELVSS.

For example, a first electrode of the first PM driving transistor Ta is connected to the first node N1, a second electrode thereof is connected to the jth second driving data line PDj, and a gate electrode thereof may be connected to the ith first control line Cai.

Therefore, the first PM driving transistor Ta may be turned on in response to a first control signal supplied to the ith first control line Cai.

When the first PM driving transistor Ta is turned on, the data signal of the jth second driving data line PDj may be transmitted to the first node N1.

Therefore, the OLED may emit light according to a potential difference between a voltage of the data signal transmitted to the first node N1 and a voltage of the second power source ELVSS.

A first electrode of the second PM driving transistor Tb may be connected to the cathode electrode of the OLED, a second electrode thereof may be connected to the second power source ELVSS, and a gate electrode thereof may be connected to the ith second control line Cbi.

Therefore, the second PM driving transistor Tb may be turned on in response to a second control signal supplied to the ith second control line Cbi.

Figure 3:
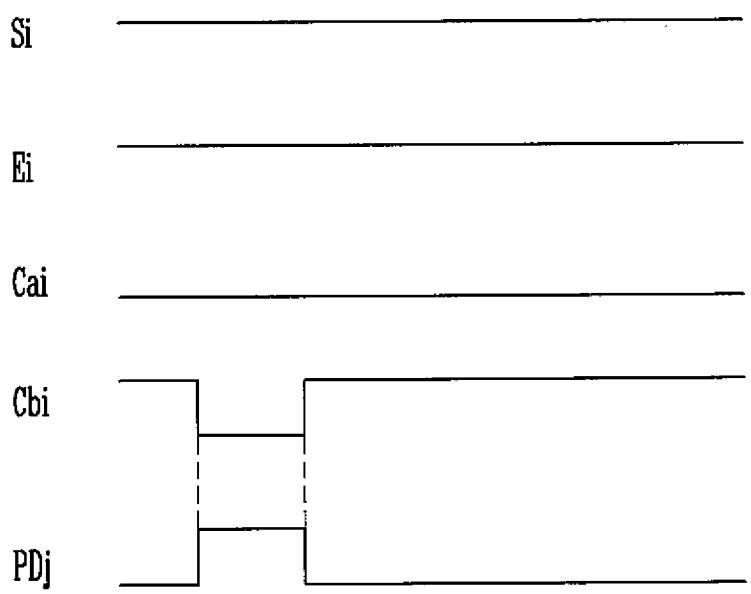
FIG. 3 is a view illustrating driving waveforms of signals supplied to the pixel of FIG. 2 when the pixel is driven by a second driving method.

FIG. 3 is a view illustrating driving waveforms of signals supplied to the pixel PXL1 of FIG. 2, when the pixel PXL1 is driven by a second driving method. Hereinafter, operation of driving the pixel PXL1 according to the second driving method will be described with reference to FIGS. 2 and 3.

Referring to FIG. 3, when the pixel PXL1 is driven by the second driving method, control signals (for example, low level signals) may be supplied (e.g., constantly or continuously supplied) to first control lines Ca1 to Can (e.g., Cai).

FIG. 3 illustrates the operation of driving the pixel PXL1 of FIG. 2, that is, the pixel PXL1 connected to the ith first control line Cai. Therefore, it is illustrated that a first control signal is supplied to the ith first control line Cai. However, the first control signal may be concurrently (e.g., simultaneously) supplied to first to (i−1)th first control lines Ca1 to Cai−1, and to (i+1)th to nth first control lines Cai+1 to Can, as well as to the ith first control line Cai.

The control signals are supplied (e.g., constantly or continuously supplied) to the plurality of first control lines Ca1 to Can during a period in which the pixel PXL1 is driven according to the second driving method (hereinafter, referred to as a second driving period), so that the first PM driving transistor Ta may be turned on (e.g., constantly or continuously turned on) during the second driving period.

Therefore, during the second driving period, whenever the data signal (for example, a high level signal) is supplied to the jth second driving data line PDj, the data voltage corresponding to the data signal may be transmitted to the first node N1.

Referring to FIG. 3, during a period in which the data signal is supplied to the second driving data line PDj, a control signal (for example, a low level signal) may be supplied to the ith second control line Cbi. Therefore, the second PM driving transistor Tb may be turned on.

As the second PM driving transistor Tb is turned on, the OLED and the second power source ELVDD are electrically connected to each other, so that the OLED may emit light according to the potential difference between the voltage of the data signal transmitted to the first node N1 and the voltage of the second power source ELVSS.

On the other hand, when the pixel PXL1 is driven by the second driving method as described above, because the first driver 100 is not driven, the scan signal, the emission control signal, and the data signal (e.g., the first driving data signal) may not be supplied to the ith scan line Si, the ith emission control line Ei, and the jth first driving data line ADj, respectively, that are connected to the first driver 100.

During a period (hereinafter, referred to as a first driving period) in which the pixel PXL1 is driven by the first driving method, according to an embodiment of the present invention, operation of driving the first driver 100 may vary according to the pixel circuit forming the first driver 100. Therefore, driving waveforms of the signals (e.g., the scan signal, the emission control signal, and the first driving data signal) that are supplied to the pixel PXL1 may vary.

Because the first driver 100 is driven by the AM driving method, operations of initializing an anode voltage of the OLED, storing a threshold voltage of the driving transistor in the storage capacitor, storing the data voltage in the storage capacitor, and controlling the driving current flowing to the OLED through the driving transistor may be performed.

On the other hand, during the first driving period, the signals (e.g., the control signal and the second driving data signal) may not be supplied to the plurality of first control lines Ca1 to Can and the plurality of second driving data lines PD1 to PDm, so that only the first driver 100 may operate.

As illustrated in FIG. 2, when a transistor (e.g., a predetermined transistor or the second PM driving transistor Tb) is provided between the OLED and the second power source ELVSS, in order to electrically connect the OLED and the second power source ELVSS, control signals may be supplied to second control lines Cb1 to Cbn.

Figure 4:
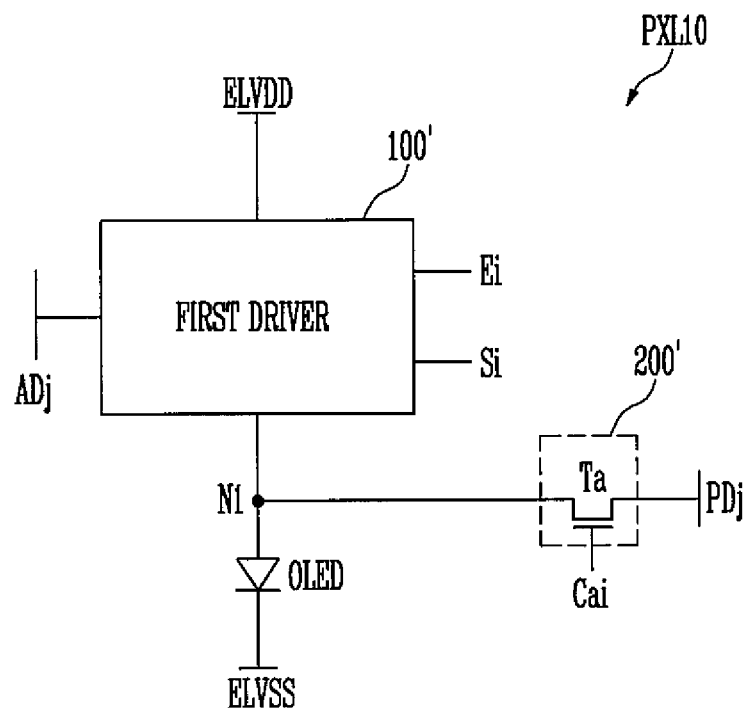
FIG. 4 is a view schematically illustrating a pixel according to another embodiment of the present invention.

FIG. 4 is a view schematically illustrating a pixel PXL10 according to another embodiment of the present invention. Here, description of elements and components that are the same or substantially the same as those described above will not be repeated, and description of elements and components that are different from those described above will be given.

Referring to FIG. 4, the pixel PXL10 may include a first driver 100', an OLED, and a second driver 200'.

Like the pixel PXL1 described above with reference to FIG. 2, the first driver 100' may control the OLED to emit light according to the AM driving method, and the second driver 200' may control the OLED to emit light according to the PM driving method.

On the other hand, as described above, because the pixel circuit structure of the first driver 100 is not limited, the first driver 100' may be the same or substantially the same as the first driver 100 according to the pixel PXL1 described above.

The OLED emits light in response to the first driving data signal supplied to the jth first driving data line ADj when the first driver 100' is driven, and the OLED emits light in response to the second driving data signal supplied to the jth second driving data line PDj when the second driver 200' is driven.

The second driver 200' may include the first PM driving transistor Ta connected between the first node N1 and the jth second driving data line PDj.

For example, a first electrode of the first PM driving transistor Ta is connected to the first node N1, a second electrode thereof is connected to the jth second driving data line PDj, and a gate electrode thereof may be connected to the ith first control line Cai.

Therefore, the first PM driving transistor Ta may be turned on in response to the first control signal supplied to the ith first control line Cai.

When the first PM driving transistor Ta is turned on, the data signal of the jth second driving data line PDj may be transmitted to the first node N1.

Therefore, the OLED may emit light according to the potential difference between the voltage of the data signal transmitted to the first node N1 and the voltage of the second power source ELVSS.

Figure 5:
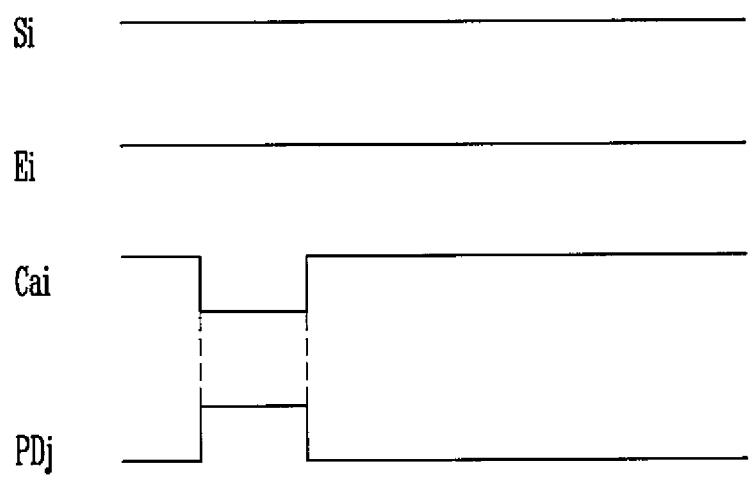
FIG. 5 is a view illustrating driving waveforms of signals supplied to the pixel of FIG. 4 when the pixel is driven by the second driving method.

FIG. 5 is a view illustrating driving waveforms of signals supplied to the pixel of FIG. 4 when the pixel is driven according to the second driving method. Hereinafter, referring to FIGS. 4 and 5, operation of driving the pixel PXL10 according to the second driving method will be described. Here, description of elements and components that are the same or substantially the same as those described above will not be repeated, and description of elements and components that are different from those described above will be given.

Referring to FIG. 5, the scan signal and the emission control signal may not be supplied to the ith scan line Si and the ith emission control line Ei that are connected to the first driver 100' during the second driving period. For example, during the second driving period, the scan signal Si and the emission control signal Ei may maintain or substantially maintain high levels.

When a control signal (for example, a low level signal) is supplied to the ith first control line Cai to turn on the first PM driving transistor Ta, the voltage of the second driving data signal supplied to the jth second driving data line PDj may be transmitted to the first node N1.

Accordingly, as illustrated in FIG. 5, during a period in which the control signal is supplied to the ith first control line Cai, the data signal (for example, the high level signal) may be concurrently (e.g., simultaneously) supplied to the jth second driving data line PDj.

Therefore, the OLED may emit light according to the potential difference between the voltage of the data signal transmitted to the first node N1 and the voltage of the second power source ELVSS.

On the other hand, the second power sources ELVSS provided to the pixels PXL10 may be connected to each other, so that a low potential voltage may be concurrently (e.g., simultaneously) supplied to all the pixels PXL10 through the second power sources ELVSS. However, in another example embodiment, second power sources ELVSS provided to a plurality of pixels PXL10 arranged in the same horizontal line may be connected to each other, and the horizontal line may be parallel with the scan lines S1 to Sn.

That is, where one second power source ELVSS is provided in the organic light emitting display device 1 in the former case, a plurality of second power source supplying units may be provided by horizontal lines in the organic light emitting display device 1 in the latter case. Therefore, in the latter case, n second power source supplying units may be provided.

When the n second power source supplying units are provided by horizontal lines in the organic light emitting display device 1, unlike in FIG. 5, during the second driving period, the control signals (for example, the low level signals) may be supplied (e.g., constantly or continuously supplied) to the first control lines Ca1 to Can.

At this time, during a period in which the data signal is supplied to the jth second driving data line PDj, a low potential voltage (e.g., a predetermined low potential voltage) is concurrently (e.g., simultaneously) supplied to the second power source ELVSS, so that the OLED may emit light.

Figure 6:
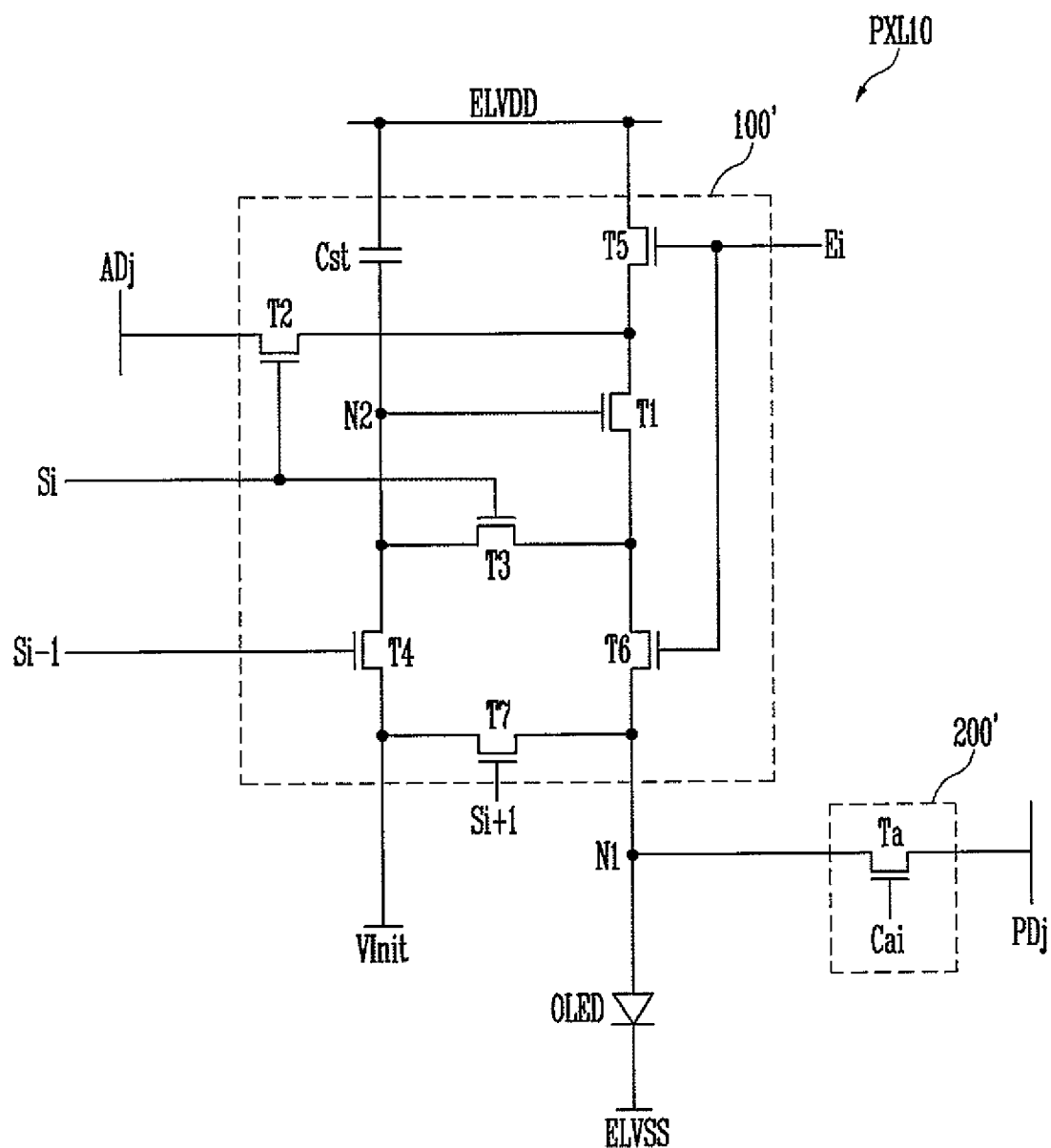
FIG. 6 is a circuit diagram illustrating the pixel of FIG. 4, according to an embodiment of the present invention.

FIG. 6 is a circuit diagram illustrating the pixel of FIG. 4, according to an embodiment of the present invention. That is, FIG. 6 illustrates an example of the first driver 100' of FIG. 4 to describe the combined driving method according to an embodiment of the present invention.

The pixel circuit structure of the first driver 100' of FIG. 6 is only an example to describe the combined driving method (e.g., the AM driving method and the PM driving method) according to an embodiment of the present invention. As described above, the pixel circuit structure of the first driver 100' is not limited to the pixel circuit structure of FIG. 6. Here, description of elements and components that are the same or substantially the same as those described above will not be repeated, and description of elements and components that are different from those described above will be given.

Referring to FIG. 6, the pixel PXL10 may include the first driver 100', the OLED, and the second driver 200'.

The (i−1)th scan line Si−1, the ith scan line Si, the (i+1)th scan line Si+1, the ith emission control line Ei, the jth first driving data line ADj, the first power source ELVDD, and an initializing power source VInit may be connected to the first driver 100'.

The first driver 100' may include a first AM driving transistor T1, a second AM driving transistor T2, a third AM driving transistor T3, a fourth AM driving transistor T4, a fifth AM driving transistor T5, a sixth AM driving transistor T6, a seventh AM driving transistor T7, and a capacitor Cst.

The first AM driving transistor T1 may be connected between the fifth AM driving transistor T5 and the sixth AM driving transistor T6. For example, a first electrode of the first AM driving transistor T1 may be connected to the fifth AM driving transistor T5, and a second electrode thereof may be connected to the sixth AM driving transistor T6.

The first AM driving transistor T1 may function as a driving transistor for supplying a driving current to the OLED.

The fifth AM driving transistor T5 may be connected between the first power source ELVDD and the first AM driving transistor T1. For example, a first electrode of the fifth AM driving transistor T5 may be connected to the first power source ELVDD, and a second electrode thereof may be connected to the first AM driving transistor T1.

The ith emission control line Ei is connected to a gate electrode of the fifth AM driving transistor T5, so that the fifth AM driving transistor T5 may be turned on or off according to the emission control signal supplied to the ith emission control line Ei.

The fifth AM driving transistor T5 may control emission of the OLED, and may disconnect (e.g., separate) a voltage of the data signal supplied to the first driving data line ADj from a voltage of the first power source ELVDD.

The sixth AM driving transistor T6 may be connected between the first AM driving transistor T1 and the OLED. For example, a first electrode of the sixth AM driving transistor T6 may be connected to the first AM driving transistor T1, and a second electrode thereof may be connected to the OLED.

The ith emission control line E1 is connected to a gate electrode of the sixth AM driving transistor T6, so that the sixth AM driving transistor T6 may be turned on or off according to the emission control signal supplied to the ith emission control line Ei.

The sixth AM driving transistor T6 may control emission of the OLED.

The second AM driving transistor T2 may be connected between the jth first driving data line ADj and the second electrode of the fifth AM driving transistor T5. For example, a first electrode of the second AM driving transistor T2 may be connected to the jth first driving data line ADj, and a second electrode thereof may be connected to the second electrode of the fifth AM driving transistor T5.

The ith scan line Si is connected to a gate electrode of the second AM driving transistor T2, so that the second AM driving transistor T2 may be turned on or off according to the scan signal supplied to the ith scan line Si. Accordingly, the second AM driving transistor T2 may supply the data voltage supplied to the first driving data line ADj to the first AM driving transistor T1.

The third AM driving transistor T3 may be connected between a second node N2 and the second electrode of the first AM driving transistor T1. For example, a first electrode of the third AM driving transistor T3 may be connected to the second node N2, and a second electrode thereof may be connected to the second electrode of the first AM driving transistor T1.

The ith scan line Si is connected to a gate electrode of the third AM driving transistor T3, so that the third AM driving transistor T3 may be turned on or off according to the scan signal supplied to the ith scan line Si. When the third AM driving transistor T3 is turned on, a threshold voltage of the first AM driving transistor T1 may be compensated for. That is, the third AM driving transistor T3 may diode-couple the first AM driving transistor T1.

The fourth AM driving transistor T4 may be connected between the second node N2 and the initializing power source VInit. For example, a first electrode of the fourth AM driving transistor T4 may be connected to the second node N2, and a second electrode thereof may be connected to the initializing power source VInit.

A gate electrode of the fourth AM driving transistor T4 is connected to the (i−−1)th scan line Si−1, so that the fourth AM driving transistor T4 may be turned on or off according to the scan signal supplied to the (i−1)th scan line Si−1.

The fourth AM driving transistor T4 may initialize a gate voltage of the first AM driving transistor T1 to a voltage supplied to the initializing power source (hereinafter, referred to as an initializing voltage).

The seventh AM driving transistor T7 may be connected between the second electrode of the fourth AM driving transistor T4 and the second electrode of the sixth AM driving transistor T6. A gate electrode of the seventh AM driving transistor T7 is connected to the (i+1)th scan line Si+1, so that the seventh AM driving transistor T7 may be turned on or off according to the scan signal supplied to the (i+1)th scan line Si+1.

The seventh AM driving transistor T7 may initialize the anode voltage of the OLED to the initializing voltage.

The capacitor Cst may be connected between the first power source ELVDD and the second node N2. For example, a first electrode of the capacitor Cst may be connected to the first power source ELVDD, and a second electrode thereof may be connected to the second node N2.

The capacitor Cst may maintain (e.g., uniformly maintain) or substantially maintain a voltage supplied to the gate electrode of the first AM driving transistor T1 (hereinafter, referred to as a gate voltage).

Because a configuration of the second driver 200' is the same or substantially the same as that of the second driver 200' illustrated with reference to FIG. 4, description thereof will be omitted.

Figure 7A:
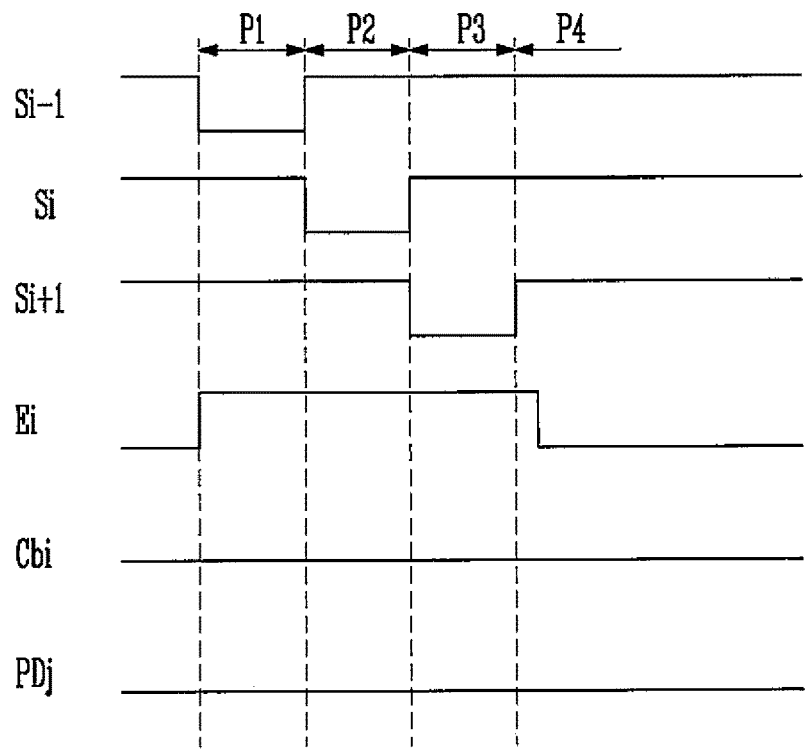
FIG. 7A is a view illustrating driving waveforms of signals supplied to the pixel of FIG. 6 when the pixel is driven by a first driving method.
Figure 7B:
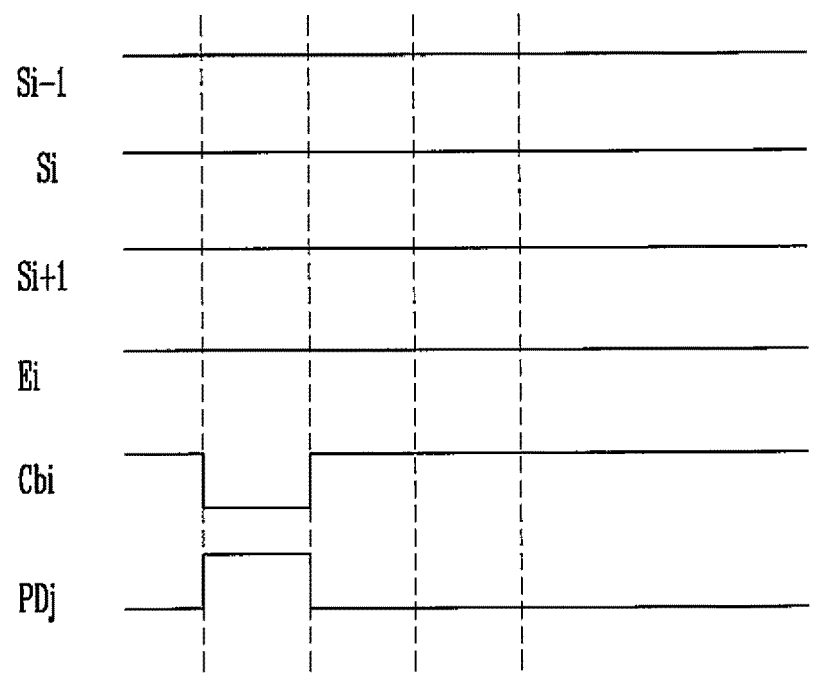
FIG. 7B is a view illustrating driving waveforms of signals supplied to the pixel of FIG. 6 when the pixel is driven by the second driving method.

FIG. 7A is a view illustrating driving waveforms of signals supplied to the pixel of FIG. 6 when the pixel is driven by a first driving method. FIG. 7B is a view illustrating driving waveforms of signals supplied to the pixel of FIG. 6 when the pixel is driven by the second driving method.

As described above, the pixel according to one or more embodiments of the present invention may be driven by the combined driving method, that is, the AM driving method and the PM driving method. Accordingly, the driving method may vary according to the situation. For example, the second driver 200' may be driven during a normal mode so that the pixel may be driven according to the PM driving method, and the first driver may be driven during a standby mode so that the pixel may be driven according to the AM driving method. However, the present invention is not limited thereto, and in another embodiment, different driving methods could be used during the different modes.

Hereinafter, operation of driving the pixel PXL10 of FIG. 6 according to the first driving method will be described.

Referring to FIG. 7A, the first driving method may include a first initializing operation, a threshold voltage compensating and data inputting operation, a second initializing operation, and a light emitting operation.

The first initializing operation may be performed during a first period P1. During the first initializing operation, the driving voltage of the OLED in the pixel PXL10 is reset. As the scan signal (for example, a low level signal) is supplied to the (i−1)th scan line Si−1 during the first period P1, the fourth AM driving transistor T4 may be turned on.

Therefore, the gate voltage of the first AM driving transistor T1 may be set as the initializing voltage.

Next, the threshold voltage compensating and data inputting operation may be performed during a second period P2.

During the threshold voltage compensating and data inputting operation, the threshold voltages of the driving transistors, that is, the first AM driving transistors T1 of the pixels PXL10 are compensated for. In accordance with factors and/or material characteristics of a manufacturing process of a panel, because the first AM driving transistors T1 of the pixels PXL10 provided in the organic light emitting display device may have different threshold voltages, due to variations in the threshold voltages, it may be difficult to correctly display brightness components of the pixels.

Therefore, to improve non-uniformity in the brightness components according to the variations in the threshold voltages of the first AM driving transistors T1 of the pixels PXL10, the threshold voltages of the first AM driving transistors T1 of all the pixels may be compensated for concurrently (e.g., simultaneously or all at once).

During the second period P2, as the scan signal (for example, a low level signal) is supplied to the ith scan line Si, the third AM driving transistor T3 is turned on so that a threshold voltage of the second node N2 may be compensated for.

In addition, during the second period P2, as the scan signal is supplied to the ith scan line Si, the second AM driving transistor T2 is turned on. At this time, the voltage of the data signal supplied to the jth first driving data line ADj may be transmitted to the first electrode of the first AM driving transistor T1.

Next, the second initializing operation may be performed during a third period P3.

During the second initializing operation, the scan signal (for example, a low level signal) is supplied to the (i+1)th scan line Si+1, so that the seventh AM driving transistor T7 is turned on. Therefore, the anode voltage of the OLED may be set as the initializing voltage.

The light emitting operation may be performed during a fourth period P4.

During the light emitting operation, the emission control signal (for example, a low level signal) is supplied to the ith emission control line Ei, so that the fifth AM driving transistor T5 and the sixth AM driving transistor T6 may be concurrently (e.g., simultaneously) turned on. Therefore, a current path is formed from the first power source ELVDD to the second power source ELVSS through the OLED, so that the OLED may emit light.

During the first driving period, signals may not be supplied to the second driving data lines PD1 to PDn and the first control lines Ca1 to Can that are connected to the second drivers 200' of the pixels PXL10.

As described above, the pixel PXL10 of FIG. 6 may be driven by the second driving method. In this case, the signals of FIG. 7B may be supplied to the second driver 200'.

Because the operation of the second driver 200' is the same or substantially the same as described with reference to FIGS. 4 and 5, repeated description will be omitted.

As described above, the first driver 100' includes the first AM driving transistor that may operate as the driving transistor. Because the driving transistor is driven during a saturation region (e.g., a predetermined saturation region), the driving transistor may consume a high voltage.

Because each pixel according to the present invention includes both the first driver (e.g., 100 or 100') for performing the AM driving method and the second driver (e.g., 200 or 200') for performing the PM driving method, the first driver may be driven when it is desirable to improve emission efficiency although a large amount of voltage is consumed, and the second driver may be driven in other situations so that it may be possible to reduce power consumption.

Each of the transistors provided in the first driver and the second driver may have the same or substantially the same channel type, for example, n-channel type or a p-channel type. However, the present invention is not limited thereto, and at least one of the transistors provided in the first driver and/or the second driver may have a different channel type from the other transistors.

The electronic or electric devices (e.g., the timing controller, the data driver, the control driver, the scan driver, etc.) and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Example embodiments have been described herein, and although specific terms are employed, they are used and are to be interpreted in a generic and descriptive sense only, and not for purposes of limitation. In some cases, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made, without departing from the spirit and scope of the present invention as set forth in the following claims, and their equivalents.

What is claimed is:

1. A pixel comprising:
a first driver connected to a first driving data line;
a second driver connected to a second driving data line; and
an organic light emitting diode (OLED) connected to both of the first driver and the second driver, the OLED being configured:
to emit light in response to a data signal supplied to the first driving data line when the first driver is driven; and
to emit light in response to a data signal supplied to the second driving data line when the second driver is driven by receiving the data signal supplied to the second driving data line at an anode of the OLED,
wherein the first driver controls the OLED to emit light by an active matrix (AM) driving method and the second driver controls the OLED to emit light by a passive matrix (PM) driving method, and
wherein the second driver comprises a first transistor including a first electrode directly connected to an anode of the OLED and a second electrode directly connected to the second driving data line such that the second driver is configured to supply the data signal supplied to the second driving data line through the first transistor to the anode of the OLED to cause the OLED to emit light by the passive matrix (PM) driving method to display an image corresponding to the data signal.

2. The pixel of claim 1, wherein a period during which the first driver is driven and a period during which the second driver is driven do not overlap with each other.

3. The pixel of claim 1, wherein the first transistor is connected to a first node and connected to the second driving data line, and
wherein a first control line configured to supply a first control signal to the second driver is connected to the second driver.

4. The pixel of claim 3, wherein the first transistor further comprises a gate electrode connected to the first control line.

5. The pixel of claim 4, wherein the OLED is configured to emit light when the first control signal is supplied to the first control line.

6. The pixel of claim 5, wherein the data signal is supplied to the second driving data line during a period in which the first control signal is supplied to the first control line.

7. The pixel of claim 4, further comprising a second transistor connected between the OLED and a second power source,
wherein a second control line configured to supply a second control signal to the second driver is connected to the second driver.

8. The pixel of claim 7, wherein the second transistor comprises a first electrode connected to the OLED, a second electrode connected to the second power source, and a gate electrode connected to the second control line.

9. The pixel of claim 8, wherein the first control signal is continuously supplied to the first control line when the second driver is driven, and
wherein the OLED is configured to emit light when the second control signal is supplied to the second control line.

10. The pixel of claim 9, wherein the data signal is supplied to the second driving data line during a period in which the second control signal is supplied to the second control line.

11. The pixel of claim 1, wherein a first power source and a scan line are connected to the first driver, the scan line being configured to supply a scan signal to the first driver, and
wherein the scan signal is not supplied to the scan line, when the second driver is driven.

12. An organic light emitting display device comprising:
a scan driver configured to supply scan signals to n (n is a natural number greater than or equal to 2) scan lines;
a data driver configured to supply first driving data signals to m (m is a natural number greater than or equal to 2) first driving data lines, and to supply second driving data signals to m second driving data lines;
a timing controller configured to supply signals for generating the first driving data signals and signals for generating the second driving data signals to the data driver; and
a plurality of pixels connected to the n scan lines, the m first driving data lines, and the m second driving data lines, a pixel from among the plurality of pixels being connected to an ith (i is a natural number less than or equal to n) scan line, a jth (j is a natural number less than or equal to m) first driving data line, and a jth second driving data line, the pixel comprising:
a first driver connected to a first power source and the jth first driving data line;
a second driver connected to the jth second driving data line; and an organic light emitting diode (OLED) connected to both of the first driver and the second driver, the OLED being configured to:
  emit light in response to a first driving data signal supplied to the jth first driving data line when the first driver is driven; and
  emit light in response to a second driving data signal supplied to the jth second driving data line when the second driver is driven by receiving the second driving data signal supplied to the jth second driving data line at an anode of the OLED,
wherein the first driver controls the OLED to emit light by an active matrix (AM) driving method, and the second driver controls the OLED to emit light by a passive matrix (PM) driving method, and
wherein the second driver comprises a first transistor including a first electrode directly connected to an anode of the OLED and a second electrode directly connected to the jth second driving data line such that the second driver is configured to supply the second driving data signal supplied to the jth second driving data line through the first transistor to the anode of the OLED to cause the OLED to emit light by the passive matrix (PM) driving method to display an image corresponding to the second driving data signal.

13. The organic light emitting display device of claim 12, further comprising a control driver configured to supply first control signals to n first control lines, wherein the pixel is connected to an ith first control line, and wherein the first transistor is connected to a first node and is connected to the jth second driving data line.

14. The organic light emitting display device of claim 13, wherein the first transistor further comprises a gate electrode connected to the ith first control line.

15. The organic light emitting display device of claim 14, further comprising a plurality of second power sources connected to the plurality of pixels, each of the second power sources connected to a plurality of the pixels arranged in an ith horizontal line being connected to each other, wherein the OLED is configured to emit light when the second driving data signal supplied to the jth second driving data line and a second power supplied to the second power sources connected to the pixels of the ith horizontal line are concurrently applied during a period in which the second driver is driven.

16. The organic light emitting display device of claim 15, wherein a corresponding one of the first control signals is continuously supplied to the ith first control line during the period in which the second driver is driven.

17. The organic light emitting display device of claim 15, wherein the scan signals are not supplied to the ith scan line during the period in which the second driver is driven.

* * * * *